United States Patent [19]

Lade et al.

[11] Patent Number: 4,529,998
[45] Date of Patent: Jul. 16, 1985

[54] AMPLIFIED GATE THYRISTOR WITH NON-LATCHING AMPLIFIED CONTROL TRANSISTORS ACROSS BASE LAYERS

[75] Inventors: Robert W. Lade; Stanley V. Jaskolski; Herman P. Schutten; Gordon B. Spellman, all of Milwaukee, Wis.

[73] Assignee: Eaton Corporation, Cleveland, Ohio

[21] Appl. No.: 391,803

[22] Filed: Jun. 24, 1982

Related U.S. Application Data

[63] Continuation of Ser. No. 120,425, Feb. 11, 1980, abandoned, which is a continuation of Ser. No. 860,724, Dec. 14, 1977.

[51] Int. Cl.³ .................................. H01L 29/74
[52] U.S. Cl. ............................. 357/38; 357/46; 357/86; 307/252 G; 307/305
[58] Field of Search .................... 357/38, 46, 86; 307/252 A, 252 B, 252 G, 252 T, 305, 311

[56] References Cited

U.S. PATENT DOCUMENTS

| | | | |
|---|---|---|---|
| 3,475,666 | 10/1969 | Hutson | 357/38 |
| 3,567,965 | 3/1971 | Weinerth et al. | 357/46 |
| 3,980,903 | 9/1976 | Jamee | 307/311 |
| 4,039,864 | 8/1977 | Tokunaga et al. | 307/252 T |

FOREIGN PATENT DOCUMENTS

| | | | |
|---|---|---|---|
| 2051440 | 3/1972 | Fed. Rep. of Germany | 357/38 A |
| 52-10085 | 1/1977 | Japan | 357/38 A |

Primary Examiner—Joseph E. Clawson, Jr.
Attorney, Agent, or Firm—Andrus, Sceales, Starke & Sawall

[57] ABSTRACT

A diode is integrated on a common substrate with a thyristor to form a parasitic transistor in the gate circuit of the thyristor for amplifying gate current thereto. In addition, gate sensitivity is further enhanced by this formation because the injection efficiency across the thyristor anode-base junction is increased, thus reducing the amount of gate current necessary to trigger the thyristor. The diode cathode, diode anode and substrate form an emitter, base and collector, respectively, of the parasitic transistor. The junction formed by the substrate and the thyristor anode region is forward biased and supplies collector current for the parasitic transistor, this junction being inactive with respect to the junction formed by the substrate and the diode anode region. Thus gate current flowing through the diode to the gate of the thyristor is increased by the additional collector current afforded by the parasitic transistor. This parasitic transistor formation enables the use of a shorted-emitter thyristor while also achieving a high degree of gate sensitivity without the usual drawbacks of temperature and dv/dt sensitivity associated with a nonshorted-emitter high gate sensitivity thyristor.

7 Claims, 5 Drawing Figures

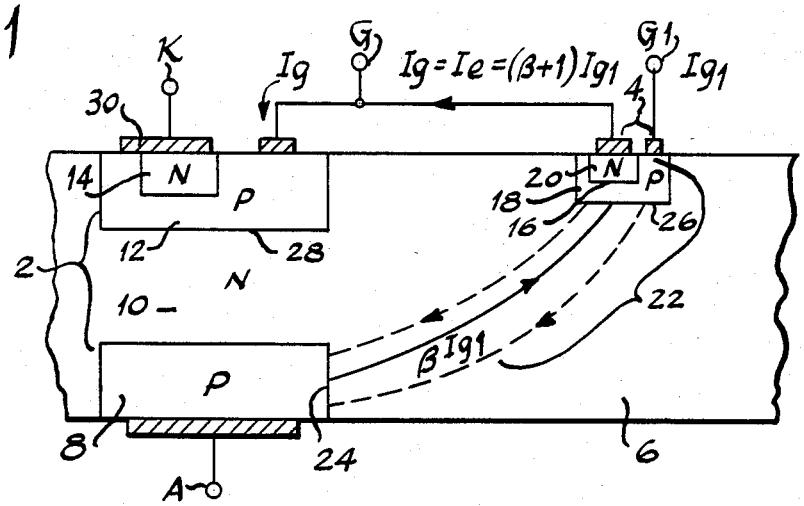
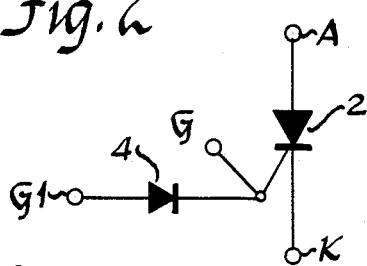
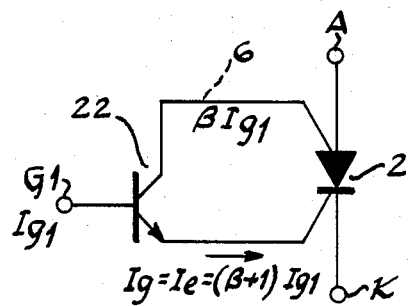
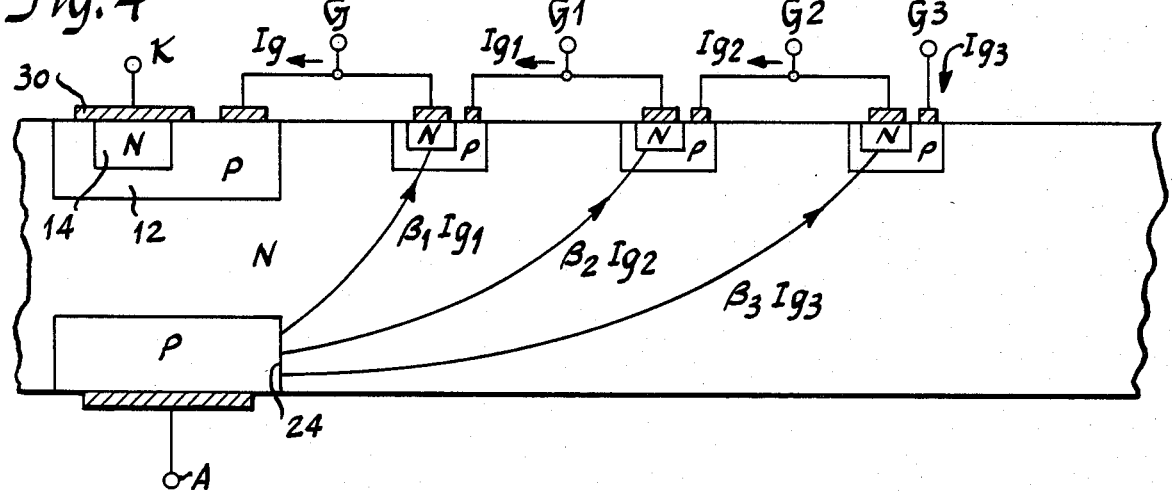
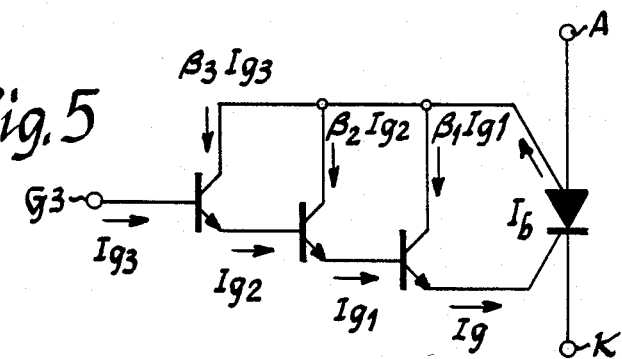

AMPLIFIED GATE THYRISTOR WITH NON-LATCHING AMPLIFIED CONTROL TRANSISTORS ACROSS BASE LAYERS

CROSS-REFERENCE TO RELATED APPLICATION

This is a continuation of application Ser. No. 120,425 filed on Feb. 11, 1980, which is a continuation of application Ser. No. 860,742 filed on Dec. 14, 1977.

BACKGROUND OF THE INVENTION

A shorted-emitter thyristor is one which, for example, has electrode metallization ohmically contacting both a cathode emitter region and a cathode base region, wherein the cathode base region has a separate gate electrode connected thereto. This type of configuration decreases gate sensitivity because of the short, thus requiring greater gate current to drive the thyristor into conduction. This configuration does, however, have the advantage of minimizing unwanted temperature and dv/dt effects.

One known manner of increasing gate sensitivity, then, is to use a nonshorted-emitter configuration wherein the electrode metallization on the cathode emitter does not also contact the cathode base. This may not be acceptable, however, in applications where temperature and dv/dt considerations cannot be sacrificed.

A known manner of increasing gate sensitivity, with a shorted-emitter configuration, is to include auxiliary means in the gate circuit of the power thyristor. Such means may be either discrete from or integrated on a common substrate with the power thyristor. In the case of the latter, it is known to integrate an auxiliary or pilot thyristor on the same substrate with a power thyristor for controlling gate current thereto. The pilot thyristor fires first in response to gate current applied thereto, after which the power thyristor fires in response to gate current enabled by conduction of the pilot thyristor, the latter gate current being that current flowing through the pilot thyristor in its low resistance, high current "on" state.

SUMMARY OF THE INVENTION

The present invention relates to auxiliary gate amplification means integrated on a common substrate with a thyristor, and more specifically to a diode integrated on the same substrate with a thyristor. Amplification is enabled by a parasitic transistor formed by the diode in conjunction with the substrate which affords additional gate current in the form of collector current.

The junction formed by the thyristor anode region and the substrate is forward biased to afford a source of collector current for the parasitic transistor. Collector current flows from the substrate to the diode anode region to the diode cathode region, i.e. from collector to base to emitter, respectively.

Gate current flows through the diode to the thyristor. Initial gate current applied to the diode anode region is effectively the base current applied to the base of the parasitic transistor. The final gate current applied to the thyristor is thus amplified because it comprises the initial gate current applied to the diode plus the additional collector current afforded by the parasitic transistor.

Gate sensitivity is also increased in another manner by the present invention because the parasitic transistor action increases the injection efficiency of the thyristor emitter and hence the required value of gate drive current is reduced.

By both reducing the required value of gate drive current and simultaneously amplifying the applied gate current, the present invention affords substantially increased gate sensitivity.

An advantageous feature of the present invention is that the amplified gate current is substantially independent of both temperature and dv/dt induced variations in the performance of the parasitic transistor, whereby not to detract from the temperature and dv/dt insensitivity of a shorted-emitter thyristor.

Other objects and advantages will appear hereinafter.

BRIEF DESCRIPTION OF THE DRAWINGS

FIG. 1 is a drawing of a substrate showing a thyristor 2 and a diode 4 integrated therein.

FIG. 2 is a circuit diagram of FIG. 1.

FIG. 3 is a circuit diagram illustrating the parasitic transistor formed by the embodiment of FIG. 1.

FIG. 4 is like FIG. 1 but shows triple diode integration.

FIG. 5 is a circuit diagram illustrating the parasitic transistors formed by the embodiment of FIG. 4.

DESCRIPTION OF THE PREFERRED EMBODIMENT

There is shown in FIG. 1 an amplified gate thyristor constructed in accordance with the invention comprising a thyristor 2 and a diode 4 integrated on a common substrate 6.

Thyristor 2 has four layers comprising: an anode emitter P type region 8; an anode base N type region 10, formed by a portion of substrate 6; a cathode base P type region 12; and a cathode emitter N type region 14. Regions 8 and 14 have anode and cathode terminals A and K, respectively, connected ohmically thereto. A gate terminal G is ohmically connected to region 12 for gating the thyristor into conduction.

Diode 4 has a rectifying PN junction 16 formed by P type anode region 18 and N type cathode region 20. A gate terminal G1 is ohmically connected to diode anode region 18, and diode cathode region 20 is ohmically connected to region 12 of the thyristor.

FIG. 2 shows the schematic circuit diagram of the embodiment of FIG. 1. Gate current applied at G1 flows through diode 4 to trigger thyristor 2 into conduction whereby load current may flow from anode A to cathode K when a power source is connected thereacross. Gate current may also be applied at terminal G to trigger thyristor 2 into conduction.

It has been found that the gate current necessary to trigger thyristor 2 into conduction is substantially less when applied at terminal G1 than when applied at G. This is because gate current applied at G1 is amplified by a parasitic transistor formed by diode 4 and substrate 6.

Referring to FIG. 1, N type region 20 forms an emitter; P type region 18 forms a base, and N type substrate 6 forms a collector, thus forming an NPN transistor 22. Electron flow is indicated by the dashed lines. Anode region 8 of thyristor 2 is positively biased and forms a collector connection to NPN transistor 22 through the forward biased anode-substrate PN junction 24.

Junction 24 is not an active junction with respect to junction 26 of the transistor because the distance therebetween is too great, i.e. minority carrier injection from region 8 across junction 24 does not substantially affect the characteristics of junction 26. Junction 24 is, however, an active junction with respect to junction 28 of the thyristor because minority carrier injection across junction 24 does substantially affect the characteristics of junction 28. It is because junction 24 is inactive with respect to junction 26 that a parasitic transistor is formed by regions 6, 18 and 20; it is because junction 24 is active with respect to junction 28 that a thyristor is formed by regions 8, 10, 12 and 14.

FIG. 3 shows the schematic circuit diagram of the parasitic transistor formed by the embodiment of FIG. 1. Substrate 6 forms the collector region of parasitic transistor 22, thus affording amplification of current applied at G1. This amplified current triggers thyristor 2 into conduction. Base current $Ig_1$ flowing into terminal G1 results in collector current $\beta Ig_1$, shown in solid line in FIG. 1, where $\beta$ is the current gain of transistor 22. $\beta Ig_1$ is an additional forward bias current at the anode-substrate junction 24, which increases the injection efficiency of anode emitter 8 of the thyristor. This additional current $\beta Ig_1$ enables a lower initial gate current $Ig_1$ to be used.

The final amplified gate current Ig applied to the gate of the power thyristor is the initial gate current $Ig_1$ applied to the diode anode plus the additional collector current $\beta Ig_1$ afforded by the parasitic transistor, i.e.

$$Ig = Ig_1 + \beta Ig_1$$
$$= (\beta + 1) Ig_1$$

FIG. 4 shows a triple diode configuration as a modification of FIG. 1; and FIG. 5 shows the circuit diagram thereof. If only terminal G3 is driven, then $$Ig_2 = \beta_3 Ig_3 + Ig_3$$
$$= (\beta_3 + 1) Ig_3$$

and $$Ig_1 = (\beta_2 + 1) Ig_2$$
$$= (\beta_2 + 1)(\beta_3 + 1) Ig_3$$

Thus the total additional bias current Ib across junction 24 is $$Ib = \beta_1 Ig_1 + \beta_2 Ig_2 + \beta_3 Ig_3$$
$$= [\beta_1 (\beta_2 + 1)(\beta_3 + 1) + \beta_2 (\beta_3 + 1) + \beta_3]Ig_3.$$

This additional forward bias current at the anode substrate junction 24 of thyristor 2 increases the injection efficiency of the anode emitter 8 of the thyristor. Thus the gate gain $Ib/Ig_3$ is $$\frac{Ib}{Ig_3} = \beta_1 (\beta_2 + 1)(\beta_3 + 1) + \beta_2 (\beta_3 + 1) + \beta_3$$

The $\beta$'s are not dependent upon location with respect to P type region 8, but only upon the NPN parasitic transistor design.

Since metallization 30 ohmically contacts regions 12 and 14, thyristor 2 is of a shorted-emitter design and thus has good temperature and dv/dt characteristics, while still affording an amplified gate since, in FIGS. 4 and 5, $$Ig = (\beta_1 + 1) Ig_1$$
$$= (\beta_1 + 1)(\beta_2 + 1) Ig_2$$
$$= (\beta_1 + 1)(\beta_2 + 1)(\beta_3 + 1) Ig_3.$$

If the diodes are formed alike, then $\beta_1 = \beta_2 = \beta_3 = \beta$, and $$Ig = (\beta+1)^3 Ig_3.$$

More generally, $Ig = (\beta + 1)^n Ig_n$ where n is the number of diodes integrated on the same substrate with the thyristor. For example, with a typical $\beta = 9$, the triple diode integration shown in FIG. 4 yielded gate current amplification on the order of $10^3$.

As aforenoted, $\beta Ig_1$ is an additional forward bias current at anode-substrate junction 24. This additional bias current increases the injection efficiency of anode emitter 8 with respect to thyristor 2 and hence reduces the required gate drive current otherwise needed to trigger thyristor 2. Increasing the injection efficiency of anode emitter 8 increases that respective $\alpha$ of the thyristor, whereby less gate current is necessary to raise the sum of the thyristor $\alpha$'s to unity.

Besides the temperature insensitivity of thyristor 2 enabled by the shorted-emitter configuration thereof, the present invention also enables the amplified gate current Ig to be insensitive to temperature induced variations of the parasitic transistor performance, as will presently be explained.

The equation from above $Ig = (\beta_1 + 1) Ig_1$ is modified to include temperature induced collector leakage current $Is_1$, $Ig = (\beta_1 = 1)(Ig_1 + Is_1)$ where $Is_1$ is the leakage current at the collector-base junction 26, FIG. 1 of the parasitic transistor, and thus $Ig = (\beta_1 + 1) Is_1 + (\beta_1 + 1) Ig_1$.

Accounting for the collector leakage currents $Is_2$ and $Is_3$ for the second and third transistors, respectively, FIG. 4, it follows:

$$Ig_1 = (\beta_2 + 1)(Ig_2 + Is_2)$$
$$Ig = (\beta_1 + 1) Is_1 + (\beta_1 + 1)(\beta_2 + 1)(Ig_2 + Is_2)$$
$$= (\beta_1 + 1) Is_1 + (\beta_1 + 1)(\beta_2 + 1) Is_2 +$$
$$(\beta_1 + 1)(\beta_2 + 1) Ig_2$$

$$Ig_2 = (\beta_3 + 1)(Ig_3 + Is_3)$$
$$Ig = (\beta_1 + 1) Is_1 + (\beta_1 + 1)(\beta_2 + 1) Is_2 +$$
$$(\beta_1 + 1)(\beta_2 + 1)(\beta_3 + 1) Is_3 +$$
$$(\beta_1 + 1)(\beta_2 + 1)(\beta_3 + 1) Ig_3$$

If $\beta_1 = \beta_2 = \beta_3 = \beta$, $Is_2 = Is_3 = Is$, the last equation for Ig can be written $$Ig = (\beta + 1)^3 Ig_3 + Is (\beta + 1)[1 + (\beta + 1) + (\beta + 1)^2]$$
$$= (\beta + 1)^3 Ig_3 + Is(\beta^3 + 4\beta^2 + 6\beta + 3).$$

The collector leakage current can be written in terms of current density Js and area As so that Is = AsJs where As is the area of the collector-base junction, e.g. 26, FIG. 1, of the parasitic transistor and Js is the current density thereat. Substituting into the last equation for Ig, $$Ig = (\beta+1)^3 Ig_3 + AsJs(\beta^3 + 4\beta^2 + 6\beta + 3).$$

The temperature induced current is the term AsJs $(\beta^3 + 4\beta^2 + 6\beta + 3)$, hence to reduce temperature sensitivity of Ig it is seen that $(\beta+1)^3 Ig_3$ must be substantially greater than the temperature induced current, i.e.

$$(\beta+1)^3 Ig_{33} >> AsJs(\beta^3 + 4\beta^2 + 6\beta + 3).$$

whereby $(\beta+1)^3 Ig_3$ will be the dominant term in the last-noted equation for Ig, and As Js $(\beta^3 + 4\beta^2 + 6\beta + 3)$ can be disregarded as insignificant with respect thereto. For a typical $\beta$ of 9, $(\beta+1)^3$ is approximately equal to $(\beta^3 + 4\beta^2 + 6\beta + 3)$, i.e. $10^3$ is approximately equal to $1.11 \times 10^3$, respectively, and hence the above-noted condition for temperature independency is $Ig_3 >> AsJs$ or equivalently $As << Ig_3/Js$.

Current density Js is typically on the order of $10^{-5}$ amps per square centimeter at $400°K$, and a typical gate triggering current $Ig_3$ is typically on the order of $10^{-5}$ amps. Thus $$\frac{Ig_3}{Js} = \frac{10^{-5} \text{ amps}}{10^{-5} \text{ amps/cm}^2} = 1 \text{ cm}^2$$

Hence, in order to achieve temperature insensitivity of Ig, the following must be satisfied: $As << 1$ square centimeter.

The dimensions of P type region 18, FIG. 1, are typically about 6 mils by 6 mils by 2 mils deep. The leakage current will appear over the area of P type region 18, thus $$As = (6 \text{ mils} \times 6 \text{ mils}) + (2 \text{ mils} \times 6 \text{ mils} \times 4)$$

$$= 84 \text{ mils}^2$$

$$= 5.4 \times 10^{-4} \text{ cm}^2.$$

Since $5.4 \times 10^{-4}$ cm$^2$ is much less than 1 cm$^2$, it is thus seen that the above requirement for temperature insensitivity is met. Even for large diodes, e.g. 60 mils by 40 mils by 2 mils whereby $As = 1.8 \times 10^{-2}$ cm$^2$, the above requirement is met and Ig is temperature independent.

The requirement for dv/dt insensitivity is similar to the temperature insensitivity requirement explained above. Keeping the collector area of the parasitic transistor small will keep the dv/dt induced base current small relative to the applied gate current $Ig_1$, FIG. 1, or $Ig_3$, FIG. 3.

It is recognized that various modifications of the present invention are possible within the scope of the appended claims, for example, though an SCR is specifically disclosed in FIG. 1, a bilateral thyristor configuration can easily be constructed.

We claim:

1. An amplified gate semiconductor switch comprising:
    a thyristor comprising four contiguous layers, the first layer being an anode region of a first conductivity type, which forms an anode emitter, the second layer being a portion of a common substrate of a second conductivity type which forms an anode base, the third layer being a gate of said first conductivity type which forms a cathode base, and the fourth layer being a cathode region of said second conductivity type which forms a cathode emitter, with separate terminals connected to said anode region, said gate region, and said cathode region;
    at least one diode integrated on said common substrate with said thyristor;
    gate bias means for generating a gate current;
    said diode comprising first and second contiguous regions of opposite conductivity types, said gate current being initially applied to said first region of said diode, said second region of said diode being connected to said gate;
    said diode and said substrate forming a transistor for non-regeneratively amplifying said gate current applied through said diode to said gate;
    said substrate comprising one of the emitter and collector of said transistor, said second region of said diode comprising the other of the emitter and collector of said transistor, and said first region of said diode comprising the base of said transistor;
    said gate, of said first conductivity type, being isolated from said first region of said diode, also of said first conductivity type, by said substrate, which is of said second conductivity type; and
    said second region of said diode, also of said second conductivity type, being isolated from said substrate by said first region;
    said four layers of said thyristor being vertically aligned in said substrate and said diode being laterally offset therefrom to insure that the substrate separation of said anode emitter region from said diode is significantly greater than the substrate separation of said anode emitter region from the remainder of said thyristor, such that said anode emitter region is regeneratively coupled with the remainder of said thyristor but not with said diode, said thyristor anode terminal supplying both the thyristor anode emitter current and the transistor collector current, without a separate dedicated electrode for said transistor collector, said gate current being limited to less than a value which would cause latching between said anode emitter region and said diode, said substrate separation between said anode emitter region and said diode being greater than a value which would cause latching between said anode emitter region and said diode, whereby said transistor formed by said diode and said substrate non-regeneratively amplifies said gate current without going into latched conduction.

2. The invention as recited in claim 1 wherein said substrate comprises the collector of said transistor and said second region of said diode comprises the emitter of said transistor.

3. The invention as recited in claim 2 wherein said cathode terminal is ohmically connected to both said third and fourth layers of said thyristor, to thus afford a shorted-emitter thyristor, and said anode terminal is ohmically connected to said first layer of said thyristor, which terminal is isolated from said second layer of said thyristor by said first layer.

4. The invention as recited in claim 3 wherein said amplified gate current is substantially independent of temperature- and dv/dt-induced variations in the performance of said transistor, and wherein thermally induced collector leakage current across said transistor is at least one order of magnitude less than said gate current.

5. The invention as recited in claim 4 comprising a plurality of said diodes integrated on said common substrate with said thyristor and serially connected to said gate, said diodes and said substrate forming a plurality of transistors having a common current source from a junction between said anode emitter region of said thyristor and said substrate for amplifying said gate current applied serially through said diodes to said gate.

6. The invention as recited in claim 5 wherein:

each said diode comprises first and second contiguous regions of opposite conductivity types, the second region of a preceding diode being connected to the first region of an immediately succeeding diode, said gate current being initially applied to the first region of the first of said diodes, the second region of the last of said diodes being connected to said gate, each of said second regions of said diodes forming the emitter of the respective transistor, said substrate forming the collector of the respective transistor, and each of said first regions forming the base of the respective transistor, said substrate forming a junction with said anode emitter region of opposite conductivity type and isolating said emitter from said diodes such that said emitter is regeneratively coupled with the rest of said thyristor but not with said diodes, which junction is biased to provide a current source for said transistors, such that amplified current from each preceding transistor is applied to the base of the immediately succeeding transistor whereby each succeeding transistor amplifies amplified current from the immediately preceding transistor.

7. The invention as recited in claim 1 wherein:

carriers generated in said thyristor affect the electrical characteristics of said diode by providing collector current from the anode of said thyristor through said substrate to said region of said first conductivity type of said diode, whereby said diode behaves as a transistor.

* * * * *